United States Patent [19]
Williamson et al.

[11] Patent Number: 5,212,593
[45] Date of Patent: May 18, 1993

[54] BROAD BAND OPTICAL REDUCTION SYSTEM USING MATCHED MULTIPLE REFRACTIVE ELEMENT MATERIALS

[75] Inventors: David Williamson; Satish DeSai, both of Bethel, Conn.

[73] Assignee: SVG Lithography Systems, Inc., Wilton, Conn.

[21] Appl. No.: 831,818

[22] Filed: Feb. 6, 1992

[51] Int. Cl.⁵ .................. G02B 17/08; G02B 27/28
[52] U.S. Cl. .................... 359/487; 359/495; 359/727; 359/728; 359/732
[58] Field of Search ............... 359/727, 732, 494-495, 359/487, 488, 497, 728

[56] References Cited

U.S. PATENT DOCUMENTS

| | | | |
|---|---|---|---|
| 3,698,808 | 10/1972 | Delmas | 355/45 |
| 3,753,608 | 8/1973 | Bernal | |
| 4,953,960 | 9/1990 | Williamson | 359/726 |
| 5,089,913 | 2/1992 | Singh et al. | 359/727 |

FOREIGN PATENT DOCUMENTS 1321303 6/1973 United Kingdom ............... 359/487

Primary Examiner—Bruce Y. Arnold
Assistant Examiner—James Phan
Attorney, Agent, or Firm—Paul A. Fattibene; Arthur T. Fattibene

[57] ABSTRACT

A broad band catadioptric optical reduction system using refractive elements made of different types of glass matched for color correction over a broad band width. A combination of fused silica and crown glass is used. An aspheric mirror is used for improved aberration correction. The optical system is adapted for use in lithography for semiconductor manufacturing in the I-line and is capable of 0.5 micron resolution at a wavelength of 365 nanometers.

13 Claims, 1 Drawing Sheet

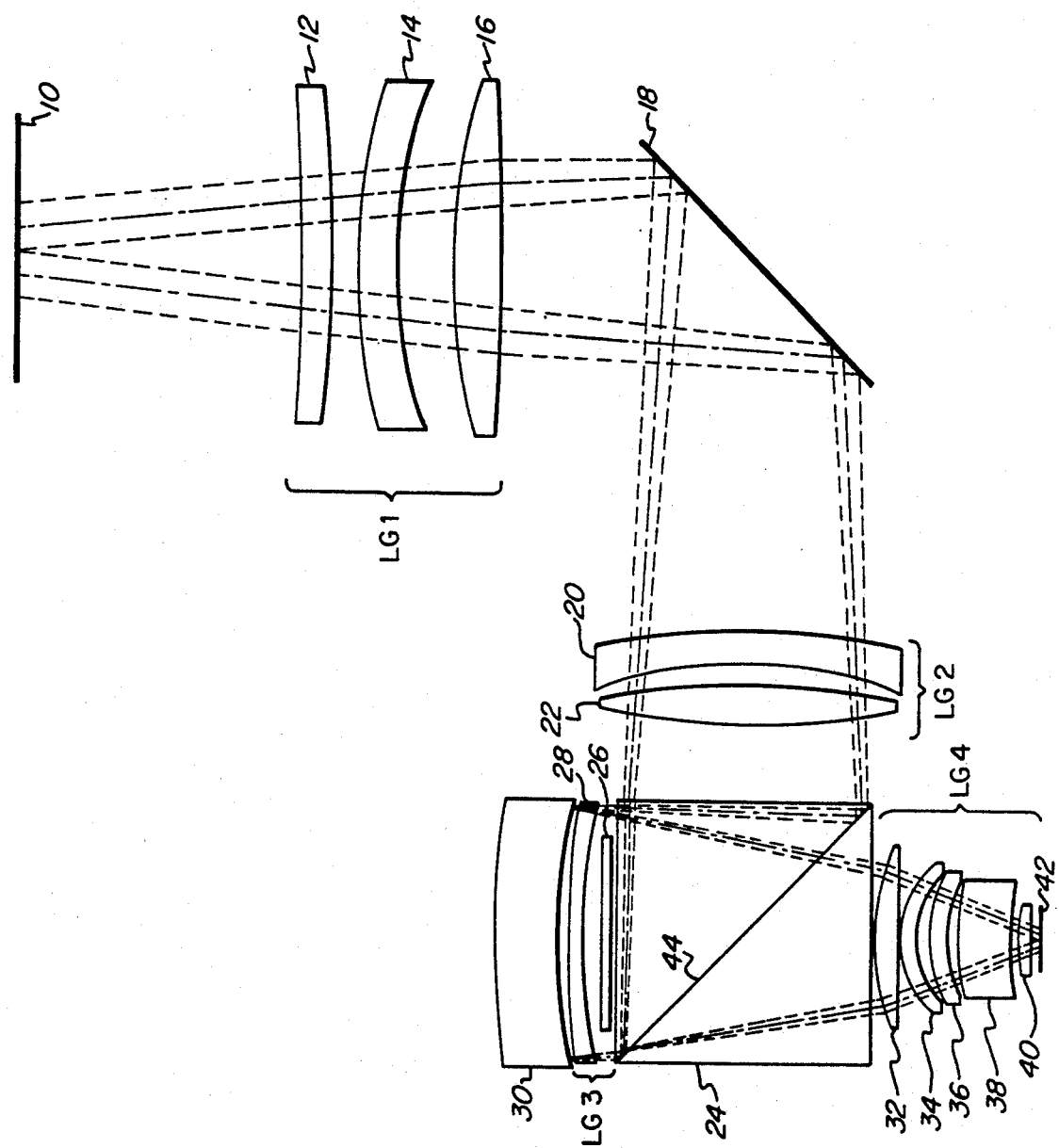

BROAD BAND OPTICAL REDUCTION SYSTEM USING MATCHED MULTIPLE REFRACTIVE ELEMENT MATERIALS

FIELD OF THE INVENTION

This invention relates generally to optical systems used in semiconductor manufacturing, and more particularly to a corrected catadioptric optical reduction system for use in the I-line.

BACKGROUND OF THE INVENTION

Semiconductors are usually manufactured using various photolithographic techniques. The circuitry used in a semiconductor is reproduced from a reticle onto a semiconductor chip. This reproduction is often accomplished with the use of optical systems. The design of these optical systems is often complex, and it is difficult to obtain the desired resolution necessary for reproducing the ever decreasing size of components being placed on a semiconductor chip. Therefore, there has been much effort expended to develop an optical reduction system capable of reproducing very fine component features in the order of 0.35 and 0.5 microns. In order to accomplish this, it is often necessary for the optical system to operate with short wavelengths of light deep in the ultraviolet region of the spectrum.

One such optical system is illustrated in U.S. Pat. No. 4,953,960 entitled "Optical Reduction System" issuing to Williamson on Sep. 4, 1990, which is herein incorporated by reference. While the optical system disclosed therein performs adequately for the intended purpose, it is not well adapted to use with longer wavelengths as used in other semiconductor manufacturing applications. Therefore, there is a need for an optical system having good correction when used in photolithography for manufacturing using a broader band wavelength, including the I-line band of the mercury spectrum.

SUMMARY OF THE INVENTION

The present invention comprises a catadioptric reduction system having, from the object to the reduced image end, a first lens group comprised of at least two different materials, a second lens group comprised of at least two different materials, a beamsplitter, a third lens, an aspheric reduction mirror, and a fourth lens group comprised of at least two different materials. Each lens group has lens elements contained therein comprised of fused silica or a crown glass. The combination of different glass materials provides for a color corrected optical reduction system operating in the wavelength between 360 and 372 nanometers, the I-line bandwidth, with very little distortion.

Accordingly, it is an object of the present invention to provide an optical reduction system for operation between the wavelengths of 360 to 372 nanometers.

It is an advantage of the present invention that it is color corrected and has very little distortion.

It is a feature of the present invention that the lens groups are comprised of at least two different materials.

These and other objects, advantages, and features will become readily apparent in view of the following detailed description.

BRIEF DESCRIPTION OF THE DRAWINGS

The FIGURE is a schematic representation illustrating the optical system of the present invention.

DETAILED DESCRIPTION OF THE PREFERRED EMBODIMENT

The FIGURE illustrates an optical reduction system according to the present invention. At the long conjugate end, an object or reticle 10 is positioned. Preferably the reticle is illuminated by radiation which is linearly polarized in the direction perpendicular to the plane of the FIGURE. A wafer 42 is positioned at the image end. Proceeding from the reticle 10 to the wafer 42 is a first lens group comprising a weak positive lens 12, a negative lens 14, and positive lens 16. Weak positive lens 12 is made from a crown glass material, such as FK 5 glass available from Schott, a well known manufacturer of optical glass. Negative lens 14 and positive lens 16 are both made of fused silica. A folding mirror 18 is disposed between the first lens group and a second lens group. The second lens group comprises a negative lens 20 and a positive lens 22. Negative lens 20 is made from fused silica. Positive lens 22 is made from crown glass. The folding mirror 18 changes the direction of radiation passing through the optical reduction system by 90 degrees. This causes the object and image planes to be parallel as well as to shorten the overall length of the optical system. A beamsplitter cube 24 is positioned adjacent the second lens group on one side. The beamsplitter cube 24 has a surface 44 thereon which causes the radiation entering the side adjacent lens group two to fold 90 degrees and to pass through a third lens group. The beamsplitter cube 24 also has a polarization selective coating on surface 44 which causes only radiation that is linearly polarized in a direction perpendicular to the plane of the FIGURE to be folded 90 degrees.

The third lens group comprises a quarter wave plate 26 and a negative lens 28. The quarter wave plate 26 has its axis at 45 degrees to the direction of polarization of the incident radiation. As a result the radiation incident from the beamsplitter cube 24 becomes circularly polarized after transmission through the quarter wave plate 26. Upon the second transmission through the quarter wave plate 26, after being reflected by the mirror 30, the radiation becomes linearly polarized in a direction parallel to the plane of the FIGURE and is therefore transmitted by the beamsplitter cube 24. The use of the polarization selective coating on surface 44 and the quarter wave plate 26 effectively reduces the attenuation of the radiation upon passing through the beamsplitter cube 24. Therefore, if the polarization selective coating on the surface 44 is not used, the quarter wave plate 26 is not needed and the third lens group is comprised of only a third lens 28.

A reduction mirror 30 is positioned adjacent the third lens group. The use of an aspheric mirror for reduction mirror 30 provides improved aberration correction over the use of a spherical mirror for reduction mirror 30. The plate 26 is made from fused silica. The negative lens 28 is made from crown glass. Opposite the third lens group adjacent the beamsplitter cube 24 is positioned a fourth lens group. The fourth lens group comprises a positive lens 32 made of crown glass, a shell 34 made of fused silica, a shell 36 made of fused silica, a weak positive lens 38 made of fused silica, and a positive lens 40 made of crown glass. Shells 34 and 36 being defined as elements that are substantially neither positive or negative lenses. A wafer 42 is positioned in the image plane adjacent lens 40.

The operation of the optical system can now be readily appreciated. An image of the reticle 10, at the object location is formed with reduction at the image location on wafer 42. Radiation, upon passing through the first lens group, is folded by mirror 18 and passes through the second lens group. The radiation then enters the beamsplitter cube 24 where it is reflected upward by surface 44 therein. The radiation entering the beamsplitter cube 24 is not collimated. This avoids ghost images. The radiation then passes through the third lens group and is reflected by mirror 30 back through the beamsplitter cube 24. Upon exiting the beamsplitter cube 24, the radiation enters the fourth lens group where it is imaged on wafer 42 at the image location.

The use of two different glass materials, as arranged in the present invention, provides for a color corrected optical reduction system capable of operating in a broad band between the wavelengths of 360 and 372 nanometers with very little distortion for a 22×5 millimeter field at the image end. Most of the positive lens elements are comprised of crown glass. Crown glass having a higher index of refraction than that of fused silica results in reduced field curvature. Additionally, the dispersion of crown glass is less than that of fused silica. This combination of lower dispersion positive lens elements and higher dispersion negative lens elements results in better chromatic correction over a broader spectral range than previously possible. Therefore, the combination of lens elements and different glass materials used in the present invention results in improved performance over a broader spectrum or band. Specifically, the present invention provides good correction over the I-line band or between the wavelengths of 360 and 372 nanometers.

Table I is a prescription indicating the construction data for an optical reduction system according to the teachings of the present invention.

TABLE I

| Surface Number | Surface Shape | Radius (mm) | Thickness (mm) | Glass |
|---|---|---|---|---|
| 1 | Spherical | Infinite | 194.1150 | Air |
| 2 | Spherical | −1184.7428 | 13.6174 | FK 5 |
| 3 | Spherical | −616.5730 | 11.9192 | Air |
| 4 | Spherical | 276.4000 | 17.8788 | FQTZ |
| 5 | Spherical | 210.0800 | 25.6556 | Air |
| 6 | Spherical | 262.3992 | 22.8571 | FQTZ |
| 7 | Spherical | −1569.5990 | 115.8881 | Air |
| 8 | Spherical | Infinite | 0.0000 | −Air |
| 9 | Spherical | Infinite | −163.8330 | −Air |
| 10 | Spherical | −343.1990 | −13.5000 | −FQTZ |
| 11 | Spherical | −169.4590 | −11.6302 | −Air |
| 12 | Spherical | −417.6020 | −14.6810 | −FK 5 |
| 13 | Spherical | 519.0970 | −37.3559 | −Air |
| 14 | Spherical | Infinite | −59.0000 | −FQTZ |
| 15 | Spherical | Infinite | 0.0000 | FQTZ |
| 16 | Spherical | Infinite | 59.0000 | FQTZ |
| 17 | Spherical | Infinite | 2.0000 | Air |
| 18 | Spherical | Infinite | 4.5000 | FQTZ |
| 19 | Spherical | Infinite | 9.2000 | Air |
| 20 | Spherical | −263.3700 | 6.6000 | FK 5 |
| 21 | Spherical | −537.1682 | 4.5000 | Air |
| 22 | Aspherical | −291.8474 | −4.5000 | −Air |
| 23 | Spherical | −537.1682 | −6.6000 | −FK 5 |
| 24 | Spherical | −263.3700 | −9.2000 | −Air |
| 25 | Spherical | Infinite | −4.5000 | −FQTZ |
| 26 | Spherical | Infinite | −2.0000 | −Air |
| 27 | Spherical | Infinite | −118.0000 | −FQTZ |
| 28 | Spherical | Infinite | −1.0000 | −Air |

TABLE I-continued

| Surface Number | Surface Shape | Radius (mm) | Thickness (mm) | Glass |
|---|---|---|---|---|
| 29 | Spherical | −85.0630 | −9.9285 | −FK 5 |
| 30 | Spherical | −413.4166 | −1.0000 | −Air |
| 31 | Spherical | −41.6090 | −7.2704 | −FQTZ |
| 32 | Spherical | −37.1820 | −6.7667 | −Air |
| 33 | Spherical | −53.0900 | −7.8493 | −FQTZ |
| 34 | Spherical | −52.3059 | −5.6405 | −Air |
| 35 | Spherical | −101.9830 | −25.3250 | −FQTZ |
| 36 | Spherical | −111.4400 | −2.8000 | −Air |
| 37 | Spherical | −75.0130 | −5.7500 | −FK 5 |
| 38 | Spherical | −678.6834 | −3.9999 | −Air |
| 39 | Spherical | Infinite | 0.0000 | −Air |

Table II illustrates the aspherical coefficients of the mirror 30.

TABLE II

| Number | E | A(4) | A(6) | A(8) | A(10) |
|---|---|---|---|---|---|
| 22 | 1.00 | $-2.733860 \times 10^{-9}$ | $-5.28608 \times 10^{-14}$ | 0 | 0 |

Although the preferred embodiment has been illustrated and described, it will be obvious to those skilled in the art that various modifications may be made without departing from the spirit and scope of this invention. What is claimed is:

1. A catadioptric optical reduction system, from the long conjugate end to the short conjugate end comprising:
    a first lens group, said first lens group including refractive elements made from at least two different materials;
    a second lens group, said second lens group including refractive elements made from at least two different materials;
    a beamsplitter;
    a third lens;
    a reduction mirror; and
    a fourth lens group, said fourth lens group including refractive elements made from at least two different materials
    arranged such that radiation entering the system passes through said first lens group, said second lens group, said beamsplitter, said third lens, is reflected by said mirror back through said third lens, through said beamsplitter, and through said fourth lens group.

2. A catadioptric optical reduction system as in claim 1 wherein said reduction mirror is spherical.

3. A catadioptric optical reduction system as in claim 1 wherein said reduction mirror is aspheric.

4. A catadioptric optical reduction system as in claim 3 further comprising:
    coating means, on said beamsplitter, for causing only radiation that is linearly polarized in a direction perpendicular to the plane of incidence to be folded ninety degrees.

5. A catadioptric optical reduction system as in claim 4 further comprising:
    a quarter wave plate positioned between said beamsplitter and said third lens.

6. A catadioptric optical reduction system as in claim 1 further comprising:
    a folding mirror positioned between said first lens group and said second lens group.

7. A catadioptric optical reduction system as in claim 1 wherein said at least two different materials are crown glass and fused silica.

8. A catadioptric optical reduction system as in claim 7 wherein:
   said first lens group includes a first positive lens made from crown glass;
   a negative lens made from fused silica glass; and
   a second positive lens made from fused silica glass.

9. A catadioptric optical reduction system as in claim 7 wherein:
   said second lens group includes a negative lens made from fused silica glass; and
   a positive lens made from crown glass.

10. A catadioptric optical reduction system as in claim 7 wherein said third lens is a negative lens made from crown glass.

11. A catadioptric optical reduction system as in claim 7 wherein:
   said fourth lens group includes a first positive lens made from crown glass;
   a first shell made from fused silica glass;
   a second shell made from fused silica glass;
   a second positive lens made from fused silica glass; and
   a third positive lens made from crown glass.

12. A catadioptric optical reduction system for use in photolithography as applied to semiconductor manufacturing, from the long conjugate end to the short conjugate end comprising:
   a first positive lens made from crown glass;
   a first negative lens made from fused silica glass;
   a second positive lens made from fused silica glass;
   a folding mirror;
   a second negative lens made from fused silica glass;
   a third positive lens made from crown glass;
   a beamsplitter made from fused silica glass;
   a quarter wave plate made from fused silica glass;
   a third negative lens made from crown glass;
   an aspheric reduction mirror;
   a fourth positive lens made from crown glass;
   a first shell made from fused silica;
   a second shell made from fused silica;
   a fifth positive lens made from fused silica;
   a sixth positive lens made from crown glass;
   arranged such that radiation entering said system passes through said first positive lens, said first negative lens, said second positive lens, and is folded by said folding mirror, and passes through said second negative lens and said third positive lens, and is reflected by said beamsplitter through said quarter wave plate and said third negative lens and is reflected by said aspheric reduction mirror back through said beamsplitter, and through said fourth positive lens, said first shell, said second shell, said fifth positive lens, and said sixth positive lens.

13. A catadioptric optical reduction system for use in photolithography as applied to semiconductor manufacturing having the following prescription:

TABLE I

| Surface Number | Surface Shape | Radius (mm) | Thickness (mm) | Glass |
|---|---|---|---|---|
| 1 | Spherical | Infinite | 194.1150 | Air |
| 2 | Spherical | −1184.7428 | 13.6174 | FK 5 |
| 3 | Spherical | −616.5730 | 11.9192 | Air |
| 4 | Spherical | 276.4000 | 17.8788 | FQTZ |
| 5 | Spherical | 210.0800 | 25.6556 | Air |
| 6 | Spherical | 262.3992 | 22.8571 | FQTZ |
| 7 | Spherical | −1569.5990 | 115.8881 | Air |
| 8 | Spherical | Infinite | 0.0000 | −Air |
| 9 | Spherical | Infinite | −163.8330 | −Air |
| 10 | Spherical | −343.1990 | −13.5000 | −FQTZ |
| 11 | Spherical | −169.4590 | −11.6302 | −Air |
| 12 | Spherical | −417.6020 | −14.6810 | −FK 5 |
| 13 | Spherical | 519.0970 | −37.3559 | −Air |
| 14 | Spherical | Infinite | −59.0000 | −FQTZ |
| 15 | Spherical | Infinite | −59.0000 | −FQTZ |
| 16 | Spherical | Infinite | 59.0000 | FQTZ |
| 17 | Spherical | Infinite | 2.0000 | Air |
| 18 | Spherical | Infinite | 4.5000 | FQTZ |
| 19 | Spherical | Infinite | 9.2000 | Air |
| 20 | Spherical | −263.3700 | 6.6000 | FK 5 |
| 21 | Spherical | −537.1682 | 4.5000 | Air |
| 22 | Aspherical | −291.8474 | −4.5000 | −Air |
| 23 | Spherical | −537.1682 | −6.0000 | −FK 5 |
| 24 | Spherical | −263.3700 | −9.2000 | −Air |
| 25 | Spherical | Infinite | −4.5000 | −FQTZ |
| 26 | Spherical | Infinite | −2.0000 | −Air |
| 27 | Spherical | Infinite | −118.0000 | −FQTZ |
| 28 | Spherical | Infinite | −1.0000 | −Air |
| 29 | Spherical | −85.0630 | −9.9285 | −FK 5 |
| 30 | Spherical | −413.4166 | −1.0000 | −Air |
| 31 | Spherical | −41.6090 | −7.2704 | −FQTZ |
| 32 | Spherical | −37.1820 | −6.7667 | −Air |
| 33 | Spherical | −53.0900 | −7.8493 | −FQTZ |
| 34 | Spherical | −52.3059 | −5.6405 | −Air |
| 35 | Spherical | −101.9830 | −25.3250 | −FQTZ |
| 36 | Spherical | −111.4400 | −2.8000 | −Air |
| 37 | Spherical | −75.0130 | −5.7500 | −FK 5 |
| 38 | Spherical | −678.6834 | −3.9999 | −Air |
| 39 | Spherical | Infinite | 0.0000 | −Air | wherein the aspherical surface has the following aspheric coefficients,

TABLE II

| Number | E | A(4) | A(6) | A(8) | A(10) |
|---|---|---|---|---|---|
| 22 | 1.00 | $-2.733860 \times 10^{-9}$ | $-5.28608 \times 10^{-14}$ | 0 | 0 |

* * * * *